(12) United States Patent
Tanio

(10) Patent No.: US 9,917,556 B2
(45) Date of Patent: Mar. 13, 2018

(54) TRANSMITTER, TRANSMISSION SYSTEM, AND TRANSMISSION METHOD

(71) Applicant: NEC Corporation, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/501,465

(22) PCT Filed: Aug. 3, 2015

(86) PCT No.: PCT/JP2015/003897
§ 371 (c)(1),
(2) Date: Feb. 3, 2017

(87) PCT Pub. No.: WO2016/021178
PCT Pub. Date: Feb. 11, 2016

(65) Prior Publication Data
US 2017/0222606 A1 Aug. 3, 2017

(30) Foreign Application Priority Data
Aug. 4, 2014 (JP) ................................. 2014-158400

(51) Int. Cl.
*H03F 3/38* (2006.01)
*H03F 3/217* (2006.01)
(Continued)

(52) U.S. Cl.
CPC .............. *H03F 3/217* (2013.01); *H03F 3/24* (2013.01); *H03G 3/10* (2013.01); *H04L 27/0008* (2013.01); *H04L 27/04* (2013.01); *H04L 27/08* (2013.01)

(58) Field of Classification Search
CPC ....................................................... H03F 3/38
(Continued)

(56) References Cited

U.S. PATENT DOCUMENTS 6,373,334 B1 * 4/2002 Melanson ............. H03F 3/2175
330/10
6,998,914 B2 * 2/2006 Robinson ................. H03C 5/00
330/10
(Continued)

FOREIGN PATENT DOCUMENTS

| JP | 2003-78451 A | 3/2003 |
|----|--------------|--------|
| JP | 2004-266398 A | 9/2004 |
| JP | 2012-60568 A | 3/2012 |

OTHER PUBLICATIONS

Antoine Frappé, "An All-Digital RF Signal Generator Using High-Speed ΔΣ Modulators", IEEE Journal of Solid-State Circuits, Oct. 2009, pp. 2722-2732, vol. 44, No. 10.
(Continued)

*Primary Examiner* — Henry Choe
(74) *Attorney, Agent, or Firm* — Sughrue Mion, PLLC

(57) ABSTRACT

A transmitter, a transmission system and a transmission method whereby AM-PM distortions can be compensated with high accuracy without affecting the functions of a predistortor, a ΔΣ modulator and so on. The transmitter includes: a baseband signal generation circuit that outputs the amplitude value and phase value of a baseband signal; a ΔΣ modulation circuit that performs a ΔΣ modulation of the outputted amplitude and phase values to output a pulse signal train; a power supply modulation circuit that supplies, to a pre-stage amplifier, a voltage determined in accordance with the outputted amplitude value; the pre-stage amplifier and a post-stage amplifier that amplify the outputted pulse signal train; and a filter circuit that generates an output signal from the pulse signal train as amplified and outputs the output signal. The power supply modulation circuit determines the voltage for canceling a phase error occurring in the post-stage amplifier.

19 Claims, 13 Drawing Sheets

(51) Int. Cl.
*H04L 27/04* (2006.01)
*H04L 27/00* (2006.01)
*H04L 27/08* (2006.01)
*H03G 3/10* (2006.01)
*H03F 3/24* (2006.01)

(58) Field of Classification Search
USPC .................................. 330/10, 251, 207 A
See application file for complete search history.

(56) References Cited

U.S. PATENT DOCUMENTS

| | | | |
|---|---|---|---|
| 7,133,649 B2* | 11/2006 | Kanazawa | ............ H03F 1/3247 |
| | | | 455/115.1 |
| 2003/0045247 A1 | 3/2003 | Hongo et al. | |
| 2004/0066229 A1 | 4/2004 | Taura et al. | |

OTHER PUBLICATIONS

Shinichi Hori, et al., "A 0.7-3 GHz Envelope ΔΣ Modulator Using Phase Modulated Carrier Clock for Multi-mode/band Switching Amplifiers," IEEE RFIC Symp. Dig., Jun. 2011, pp. 35-38.
Takashi Maehata, et al., "High ACLR 1-bit Direct Radio Frequency Converter Using Symmetric Waveform," Proceedings of the 7th European Microwave Integrated Circuits Conference, Oct. 29-30, 2012, pp. 671-674.
International Search Report of PCT/JP2015/003897, dated Oct. 6, 2015. [PCT/ISA/210].
Written Opinion of PCT/JP2015/003897, dated Oct. 6, 2015. [PCT/ISA/237].

* cited by examiner

TRANSMITTER, TRANSMISSION SYSTEM, AND TRANSMISSION METHOD

CROSS REFERENCE TO RELATED APPLICATIONS

This application is a National Stage of International Application No. PCT/JP2015/003897 filed Aug. 3, 2015, claiming priority based on Japanese Patent Application No. 2014-158400, filed Aug. 4, 2014, the contents of all of which are incorporated herein by reference in their entirety.

TECHNICAL FIELD

The present invention relates to transmitters, transmission systems and transmission methods, and in particular, a transmitter, a transmission system and a transmission method for transmitting a signal with $\Delta\Sigma$ modulation.

BACKGROUND ART

A transmitter used for telecommunication and broadcasting apparatuses such as a mobile telephone system and a wireless LAN apparatus needs to maintain the waveforms of transmitted signals with high accuracy while keeping its power consumption low. In recent years research and development is underway concerning a digital transmitter employing a combination of a $\Delta\Sigma$ modulator and a Class-D amplifier, which is expected to be a high power efficiency transmitter. Modulation methods for modulation by a $\Delta\Sigma$ modulator of a digital transmitter include envelope $\Delta\Sigma$ modulation, lowpass $\Delta\Sigma$ modulation, and bandpass $\Delta\Sigma$ modulation. These are disclosed in NPL 1-3 and other literature. A digital transmitter employing a combination of a $\Delta\Sigma$ modulator and a Class-D amplifier is disclosed, for example, in PLT 1 and other literature.

A block configuration diagram of a wireless communication device disclosed in PTL 1 is illustrated in FIG. 12. A wireless communication device 900 illustrated in FIG. 12 includes a baseband signal generator 910, an up-converter 920, a Class-D amplifier 930 and a bandpass filer 940. The Class-D amplifier 930 includes a bandpass $\Delta\Sigma$ modulator 931, a drive amplifier 932, a switching voltage controller 933, and a Class-D amplification unit 934.

The wireless communication device 900 generates a baseband signal in the baseband signal generator 910, up-converts the generated baseband signal to a carrier frequency fc in the up-converter 920, and $\Delta\Sigma$ modulates the carrier frequency signal in the bandpass $\Delta\Sigma$ modulator 931 of the Class-D amplifier 930. The $\Delta\Sigma$ modified carrier frequency signal is amplified in the drive amplifier 932 and the Class-D amplification unit 934, and then restored in the bandpass filer 940 and transmitted to the outside as a transmission signal.

In the wireless communication device 900 of PTL 1, the switching voltage controller 933 controls the switching voltage threshold value of the Class-D amplification unit 934 at an optimal value, based on the effective power value of the input signal to the Class-D amplification unit 934. Therefore, even when the drive amplifier 932 is disposed anterior to the Class-D amplification unit 934, deterioration of the EVM (Error Vector Magnitude) of the transmitted signal is reduced.

CITATION LIST

Patent Literature

[PTL 1] Japanese Laid-Open Patent Application Publication No. 2012-060568.

Non Patent Literature

[NPL 1] S. Hori, K. Kunihiro, K. Takahashi, and M. Fukaishi, "A 0.7-3 GHz envelope $\Delta\Sigma$ modulator using phase modulated carrier clock for multimode/band switching amplifiers," IEEE RFIC Symp. Dig., pp. 35-38, June 2011.

[NPL 2] Antoine Frappe, "An All-Digital RF Signal Generator Using High-Speed Modulators", IEEE JOURNAL OF SOLID-STATE CIRCUITS, VOL. 44, NO. 10, October 2009, p. 2722-2732.

[NPL 3] T. Maehata, S. Kameda, and N. Suematsu, "High ACLR 1-bit Direct Radio Frequency Converter Using Symmetric Waveform," Proc. 42nd European Microwave Conf., pp. 1051-1054, November 2012.

SUMMARY OF INVENTION

Technical Problem

However, when the input signal is a modulated signal in e.g. W-CDMA or LTE, the duty cycle of an output pulse signal outputted from the bandpass $\Delta\Sigma$ modulator 931 and the Class-D amplification unit 934 constantly changes as time progresses. This results in an AM (Amplitude Modulation)-PM (Phase Modulation) distortion in the transmission signal outputted from the bandpass filer 940. For example, as illustrated in FIG. 13, the distortion of the transmission signal increases as the duty cycle increases. In this case, the spectrum is distorted in the vicinity of the carrier frequency, and the ACLR (adjacent channel leakage power ratio) will not reach the standard value.

AM-PM distortion can be compensated by, for example, applying DPD (digital pre-distortion), which is a distortion compensation technique for analog transmitters. DPD is a technique for achieving signal amplification with a low distortion by distorting the input signal by a pre-distorter before the signal is input to the amplifier and thereby canceling the distortion that occurs in the amplifier. More specifically, DPD makes a model of distortion characteristics of the amplifier corresponding to the amplitude component of the input signal to the amplifier to compute a non-linear filter having inverse characteristics and apply the inverse characteristics to the input signal in the pre-distorter.

In applying the above-described DPD to a digital transmitter, since the input signal of the $\Delta\Sigma$ modulator is changed by the pre-distorter, the characteristics of the $\Delta\Sigma$ modulator should be taken into consideration. Accordingly, compensating AM-PM distortion by DPD requires disposing a pre-distorter and a $\Delta\Sigma$ modulator corresponding to the relevant Class-D amplifier.

However, in many cases digital transmitters include a plurality of Class-D amplifiers connected in parallel in accordance with output power and frequencies required in respective transmitters. For example, in a digital transmitter deployed in a distribution antenna system, a plurality of transmission units are disposed, and each transmission unit is provided with a Class-D amplifier, a bandpass filer, and an antenna. When DPD is applied to a digital transmitter deployed in a distribution antenna system, a pre-distorter and a ΔΣ modulator corresponding to each Class-D amplifier need to be provided, and the size and cost of the apparatus greatly increase as the number of Class-D amplifiers increases.

The present invention is made in view of the above-described problem and a purpose of the invention is to provide a transmitter, a transmission system, and a transmission method for compensating AM-PM distortion with high accuracy without affecting functions of a pre-distorter, a ΔΣ modulator, or other devices.

Solution to Problem

To achieve the above-described purpose, a transmitter according to the present invention includes: a baseband signal generation means for outputting an amplitude value and a phase value of a baseband signal; a ΔΣ modulation means for ΔΣ modulating the outputted amplitude value and phase value, and outputting a pulse signal train; a power supply modulation means for determining a voltage based on the outputted amplitude value, and supplying the determined voltage to an anterior amplifier; the anterior amplifier using the supplied voltage to adjust a level of the outputted pulse signal train; a posterior amplifier for amplifying the pulse signal train the level of which has been adjusted; and a filtering means for generating an output signal from the amplified pulse signal train and outputting the output signal; wherein the power supply modulation means determines, based on the outputted amplitude value, a voltage for canceling a phase error that occurs in the posterior amplifier.

To achieve the above-described purpose, a transmission system according to the present invention includes: a baseband signal generation means for outputting an amplitude value and a phase value of a baseband signal; a ΔΣ modulation means for ΔΣ modulating the outputted amplitude value and phase value, and outputting a pulse signal train; a branching means for branching the outputted pulse signal train into n parts and outputting the parts; n transmission circuits to which the n parts of the branched pulse signal train are respectively inputted; wherein each of the n transmission circuits includes: an extracting means for extracting an amplitude value of a baseband component from the inputted pulse signal train and outputs the amplitude value; a power supply modulation means for determining a voltage for canceling a phase error that occurs in a posterior amplifier, based on the amplitude value of the extracted baseband component, and for supplying the determined voltage to an anterior amplifier; the anterior amplifier using the supplied voltage to adjusting a level of the inputted pulse signal train; the posterior amplifier amplifying the pulse signal train the level of which has been adjusted; and a filtering means for generating an output signal from the amplified pulse signal train and outputting the output signal.

To achieve the above-described purpose, a transmission method according to the present invention is a transmission method using a transmitter comprising an anterior amplifier using a supplied voltage to adjust a level of a pulse signal train and a posterior amplifier for amplifying the inputted pulse signal train, the method comprising: outputting an amplitude value and a phase value of a baseband signal; ΔΣ modulating the outputted amplitude value and phase value and outputting a pulse signal train; determining a voltage, based on the outputted amplitude value, for canceling a phase error that occurs in the posterior amplifier, and supplying the determined voltage to the anterior amplifier; adjusting in the anterior amplifier a level of the outputted pulse signal train; amplifying in the posterior amplifier the pulse signal train the level of which is adjusted; and generating an output signal from the amplified pulse signal train and transmitting the output signal.

Advantageous Effects of Invention

Above-described aspects of the present invention provide a transmitter, a transmission system, and a transmission method for compensating AM-PM distortion with high accuracy without affecting functions of a pre-distorter, a ΔΣ modulator, or other devices.

DESCRIPTION OF EMBODIMENTS

<First Example Embodiment>

Figure 1:
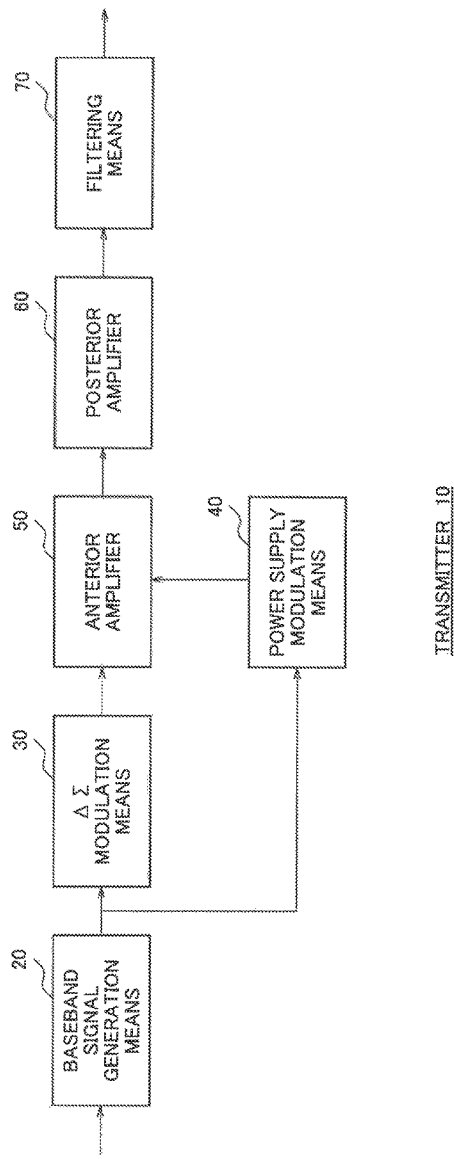
FIG. 1 is a block configuration diagram of a transmitter 10 according to a first example embodiment.

A first example embodiment of the present invention will be described. A block configuration diagram of a transmitter according to the present example embodiment is illustrated in FIG. 1. In FIG. 1, the transmitter 10 includes a baseband signal generation means 20, a ΔΣ modulation means 30, a power supply modulation means 40, an anterior amplifier 50, a posterior amplifier 60, and a filtering means 70.

The baseband signal generation means 20 generates an amplitude value and a phase value of the baseband signal, outputs the generated amplitude value and phase value of the baseband signal to the ΔΣ modulation means 30, and outputs the amplitude value of the baseband signal to the power supply modulation means 40.

The ΔΣ modulation means 30 ΔΣ modulates the inputted amplitude value and phase value of the baseband signal, and quantizes the values into a binary pulse signal train. The ΔΣ modulation means 30 outputs the quantized pulse signal train to the anterior amplifier 50. The ΔΣ modulation means 30 performs ΔΣ modulation by using envelope ΔΣ odulation, lowpass ΔΣ modulation, or bandpass ΔΣ modulation.

The power supply modulation means 40 determines a voltage for canceling a phase error that occurs in the posterior amplifier 60, based on the amplitude value of the inputted baseband signal, and supplies the determined voltage to the anterior amplifier 50.

The anterior amplifier 50 adjusts the level of pulse signal train inputted from the ΔΣ modulation means 30 by using the voltage supplied by the power supply modulation means 40, and outputs the pulse signal train to the posterior amplifier 60. The anterior amplifier 50 according to the present example embodiment adjusts the level of the pulse signal train in such a way as to give the pulse signal train an AM-PM distortion having an inverse characteristic of the AM-PM distortion that occurs in the posterior amplifier 60.

The posterior amplifier 60 may be, for example, a Class-D amplifier, and amplifies the pulse signal train inputted from the anterior amplifier 50 with the pattern of the pulse signal train maintained, and outputs the pulse signal train to the filtering means 70.

The filtering means 70 restores the inputted pulse signal train, and transmits the transmission signal from an antenna to the outside.

In the transmitter 10 configured as above, the power supply modulation means 40 determines a voltage for canceling the phase error that occurs in the posterior amplifier 60, based on the amplitude value of the inputted baseband signal, and supplies the voltage to the anterior amplifier 50. In this case, an inverse characteristic of the AM-PM distortion that occurs in the posterior amplifier 60 is added to the pulse signal train in the anterior amplifier 50, and a high quality output pulse signal with phase errors removed is inputted to the filtering means 70.

Therefore, the transmitter 10 according to the present example embodiment can compensate AM-PM distortion with high accuracy, without affecting the functions of the ΔΣ modulation means 30 or the like.

The power supply modulation means 40 may have a table in which voltage values respectively associated with amplitude values are registered, extract from the table a voltage value associated with the amplitude value of the inputted baseband signal, generate a voltage corresponding to the selected voltage value, and supply the voltage to the anterior amplifier 50. In this case, it is desirable to detect a phase error by comparing the signal to be inputted to the anterior amplifier 50 and the signal outputted from the posterior amplifier 60, and update the table of the power supply modulation means 40 as appropriate, using the detected phase error and the amplitude value.

<Second Example Embodiment>

Figure 2:
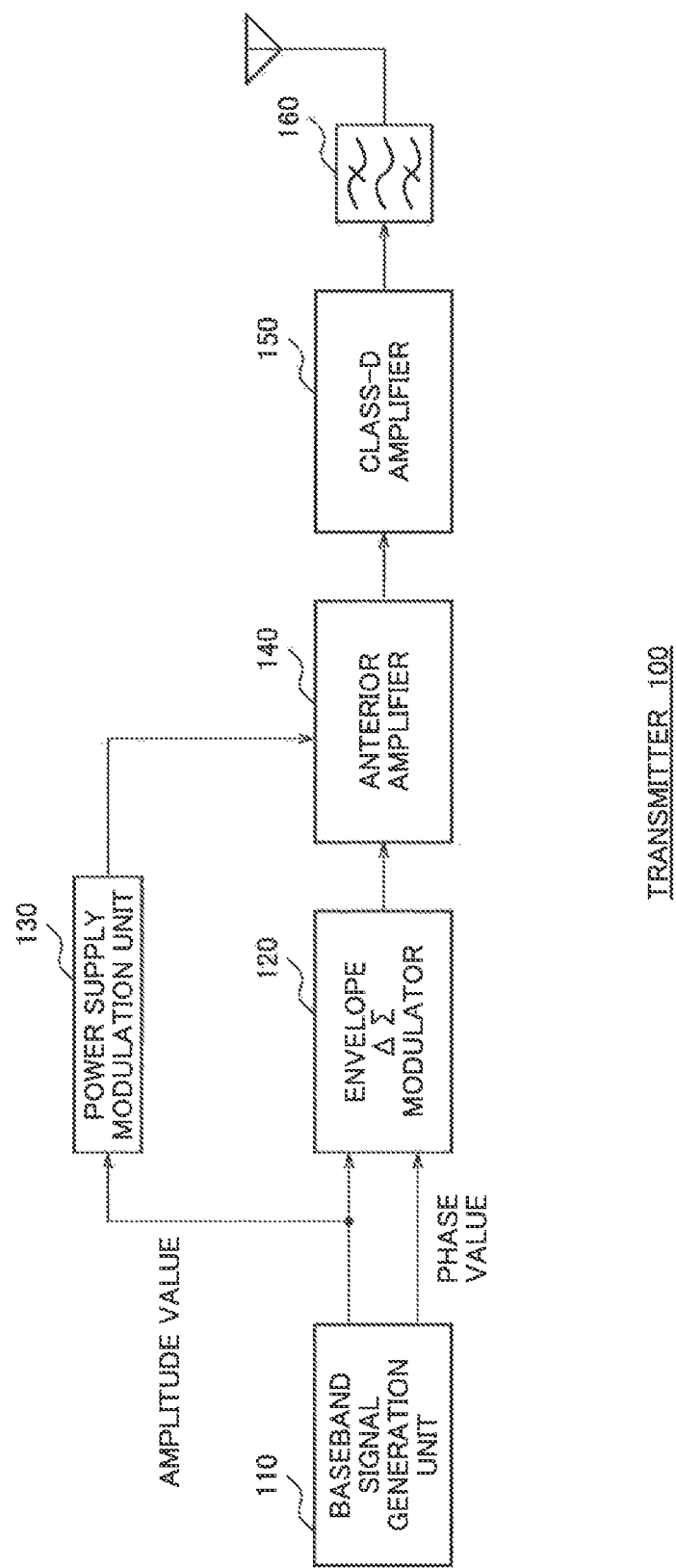
FIG. 2 is a block configuration diagram of a transmitter 100 according to a second example embodiment.

A second example embodiment will be described. A transmitter according to the present example embodiment may be used, for example, for a telecommunication and broadcasting apparatus such as a mobile telephone system and a wireless LAN (Local Area Network) apparatus. A block configuration diagram of a transmitter according to the present example embodiment is illustrated in FIG. 2. A transmitter 100 illustrated in FIG. 2 includes a baseband signal generation unit 110, an envelope ΔΣ modulator 120, a power supply modulation unit 130, an anterior amplifier 140, a Class-D amplifier 150, and a bandpass filer 160.

The baseband signal generation unit 110 generates two kinds of signals, amplitude value and phase value, of the input baseband signal and outputs the signals. The baseband signal generation unit 110 outputs the generated amplitude value and phase value to the envelope ΔΣ modulator 120, and outputs the generated amplitude value to the power supply modulation unit 130.

The envelope ΔΣ modulator 120 generates a pulsed signal (hereinafter referred to as output pulse signal) by executing a predetermined processing on the two signals, amplitude value and phase value, inputted from the baseband signal generation unit 110, and outputs the output pulse signal to the anterior amplifier 140. The envelope ΔΣ modulator 120 is implemented by, for example, a circuit configuration described in NPL 1. Details of operation of the envelope ΔΣ modulator 120 are disclosed in NPL 1 and other literature, and details thereof will not be described herein.

Figure 3:
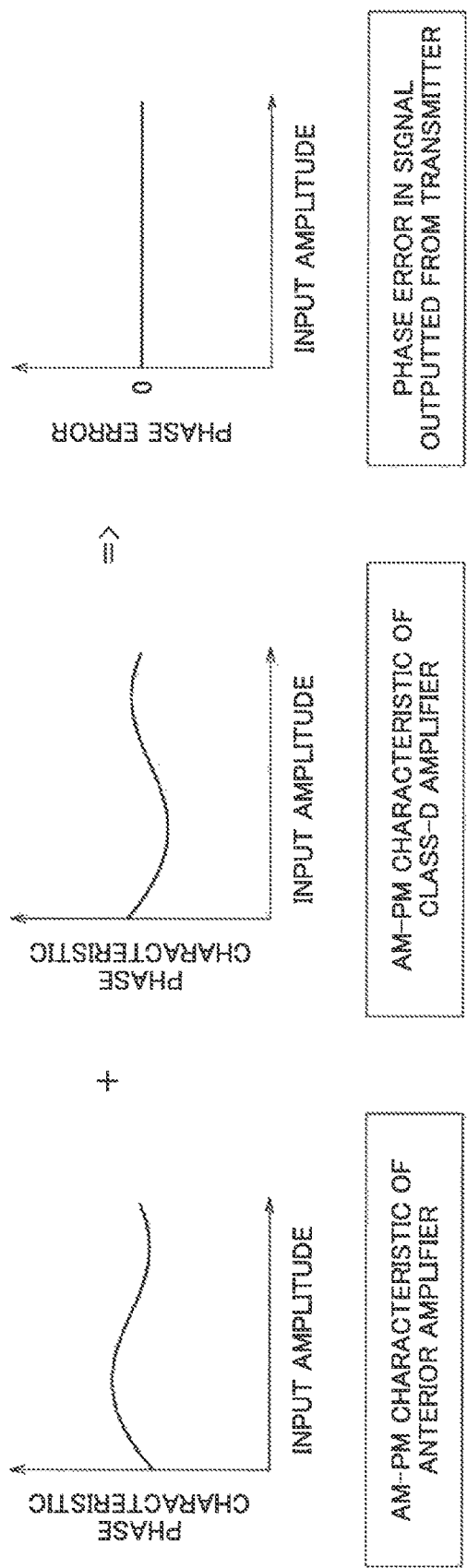
FIG. 3 is an illustration for describing a function of a power supply modulation unit 130 according to a second example embodiment.

The power supply modulation unit 130 calculates a voltage for canceling the AM-PM characteristic (phase characteristic of the output signal at the time of the amplification of the input signal amplitude) of the Class-D amplifier 150, based on the amplitude value inputted from the baseband signal generation unit 110, and supplies the voltage to the anterior amplifier 140. Specifically, the power supply modulation unit 130 calculates a voltage such that the AM-PM distortion that occurs in the anterior amplifier 140 (the graph on the left in FIG. 3) has an inverse characteristic of the AM-PM distortion that occurs in the Class-D amplifier 150 (the graph in the center in FIG. 3), and supplies the voltage to the anterior amplifier 140. The AM-PM distortion that occurs in the Class-D amplifier 150 and the AM-PM distortion that occurs in the anterior amplifier 140 cancel each other, and a high quality signal with the phase error removed is outputted from the Class-D amplifier 150 (the graph on the right in FIG. 3).

The anterior amplifier 140 amplifies the output pulse signal inputted from the envelope ΔΣ modulator 120, with the voltage supplied by the power supply modulation unit 130, and outputs the amplified signal to the Class-D amplifier 150.

The Class-D amplifier 150 amplifies the output pulse signal inputted from the anterior amplifier 140 to a desired level, with the pattern of the pulse train maintained, and outputs the amplified output pulse signal to the bandpass filer 160. Here, most of the power consumption in the transmitter 100 generally takes place in the Class-D amplifier. The Class-D amplifier 150 theoretically has a power conversion efficiency of 100% if there is no power loss caused by parasitic elements. Thus, subjecting the output pulse signal to be inputted to the Class-D amplifier 150 to the process for canceling an AM-PM distortion that occurs in the Class-D amplifier 150 allows a reduction of the power loss occurring in the Class-D amplifier 150, thereby reducing the power consumption of the transmitter 100.

The bandpass filer 160 restores the output pulse signal inputted from the Class-D amplifier 150 to an RF (Radio Frequency) signal and outputs the RF signal.

As described above, in the transmitter 100 according to the present example embodiment, the power supply modulation unit 130 calculates a voltage for canceling the AM-PM characteristic of the Class-D amplifier 150, based on the amplitude value inputted from the baseband signal generation unit 110, and supplies the voltage to the anterior amplifier 140. As the signal passes through the anterior amplifier 140 and the Class-D amplifier 150, the AM-PM distortions cancel out each other, and the RF signal is outputted from the bandpass filer 160 with distortions curtailed. In other words, the transmitter 100 can satisfy the distortion standard value ACLR.

The anterior amplifier 140 and the Class-D amplifier 150 are separately provided in the present example embodiment, but the anterior amplifier 140 may be provided in the Class-D amplifier 150.

When the processing time in the envelope ΔΣ modulator 120 differs greatly from the processing time in the power supply modulation unit 130, it is difficult to synchronize the voltage supplied to the anterior amplifier 140 with the output pulse signal. In such a case, it is preferable to add a delay unit to the transmitter, in order to match the delay amounts in the two processes by adding a delay amount to the process having a smaller delay amount. This delay adjustment can be applied to all of the following example embodiments.

<Modification of the Second Example Embodiment>

In the second example embodiment, the modulation method applied to the ΔΣ modulator has been described as envelope ΔΣ modulation but the choice of modulation method is not limited to this. Lowpass ΔΣ modulation or bandpass ΔΣ modulation may be applied in place of envelope ΔΣ modulation.

Figure 4:
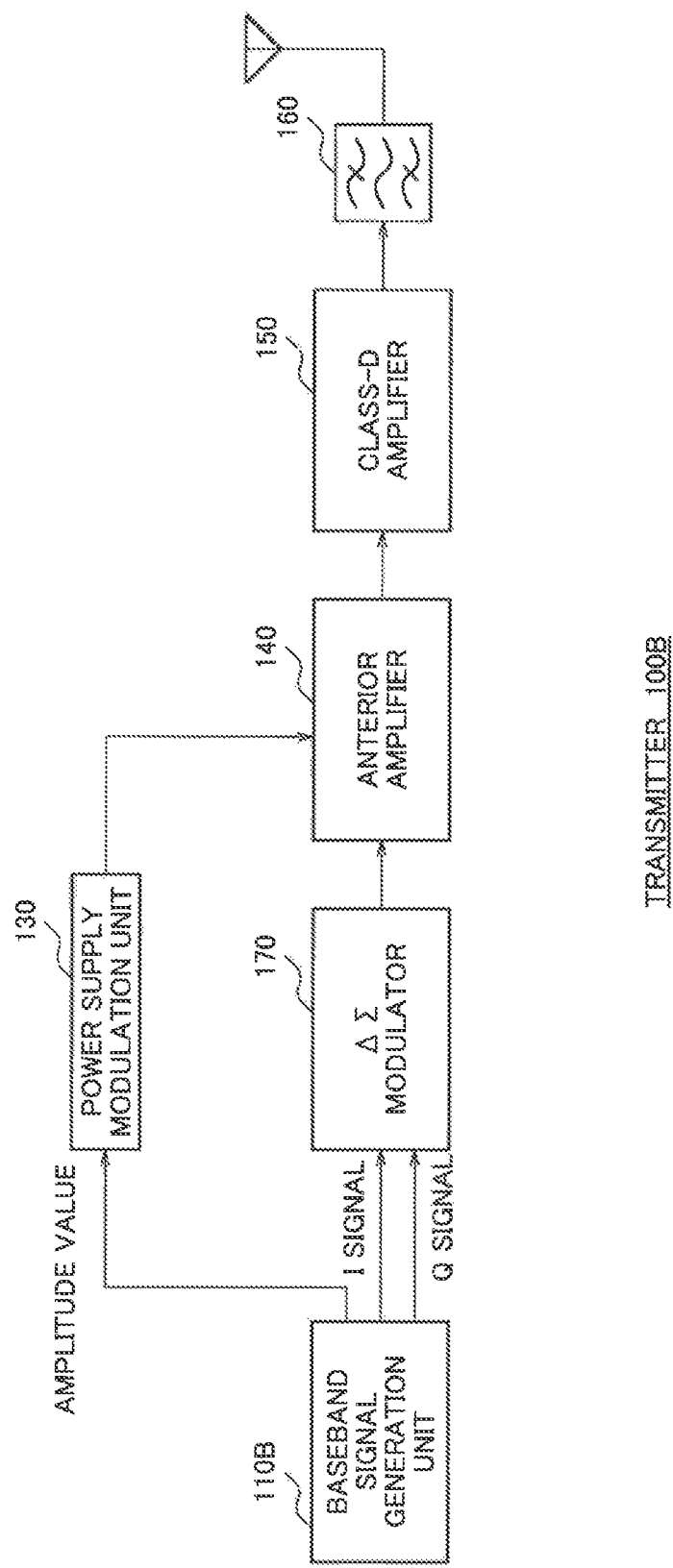
FIG. 4 is a block configuration diagram of a transmitter 100B according to a modification of the second example embodiment.

A block configuration diagram of a transmitter according to a modification of the second example embodiment is illustrated in FIG. 4. A transmitter 100B in FIG. 4 includes a baseband signal generation unit 110B, a ΔΣ modulator 170, a power supply modulation unit 130, an anterior amplifier 140, a Class-D amplifier 150, and a bandpass filer 160. The power supply modulation unit 130, the anterior amplifier 140, the Class-D amplifier 150, and the bandpass filer 160 are similar to those of the transmitter 100 in FIG. 2 according to the second example embodiment.

The baseband signal generation unit 110B generates an I signal and a Q signal of the input signal and outputs the signals to the ΔΣ modulator 170, calculates an amplitude value, using the I signal and the Q signal, and outputs the amplitude value to the power supply modulation unit 130. The baseband signal generation unit 110B according to the present example embodiment calculates the amplitude value a to be outputted to the power supply modulation unit 130 according to the equation (1).

$$\text{amplitude value } a=\sqrt{A_I^2+A_Q^2} \quad \text{Equation (1)}$$

In equation (1), $A_I$ is the amplitude value of the I signal, $A_Q$ is the amplitude value of the Q signal. Note that the amplitude value a may be calculated in a place different from the baseband signal generation unit 110B.

The ΔΣ modulator 170 quantizes the I signal and the Q signal inputted from the baseband signal generation unit 110B, by applying lowpass ΔΣ modulation or bandpass ΔΣ modulation, and outputs the output pulse signal to the anterior amplifier 140. Lowpass ΔΣ modulation and bandpass ΔΣ modulation are respectively described in detail in NPL 2 and NPL 3, and details thereof will not be described herein.

Next, a transmitter according to another modification of the second example embodiment will be described. In the second example embodiment, the amplitude value outputted from the baseband signal generation unit 110 is inputted to the power supply modulation unit 130, but the input to the power supply modulation unit 130 is not limited thereto. For example, the baseband component of the output spectrum of the envelope ΔΣ modulator 120 is the same as the spectrum of the amplitude value inputted to the ΔΣ modulator, according to a principle of envelope ΔΣ modulation. As another modification of the second example embodiment, a transmitter exploiting this property will be described, in which the baseband component is extracted from the output pulse signal of the envelope ΔΣ modulator 120 and inputted to the power supply modulation unit 130 as the vibration value.

Figure 5:
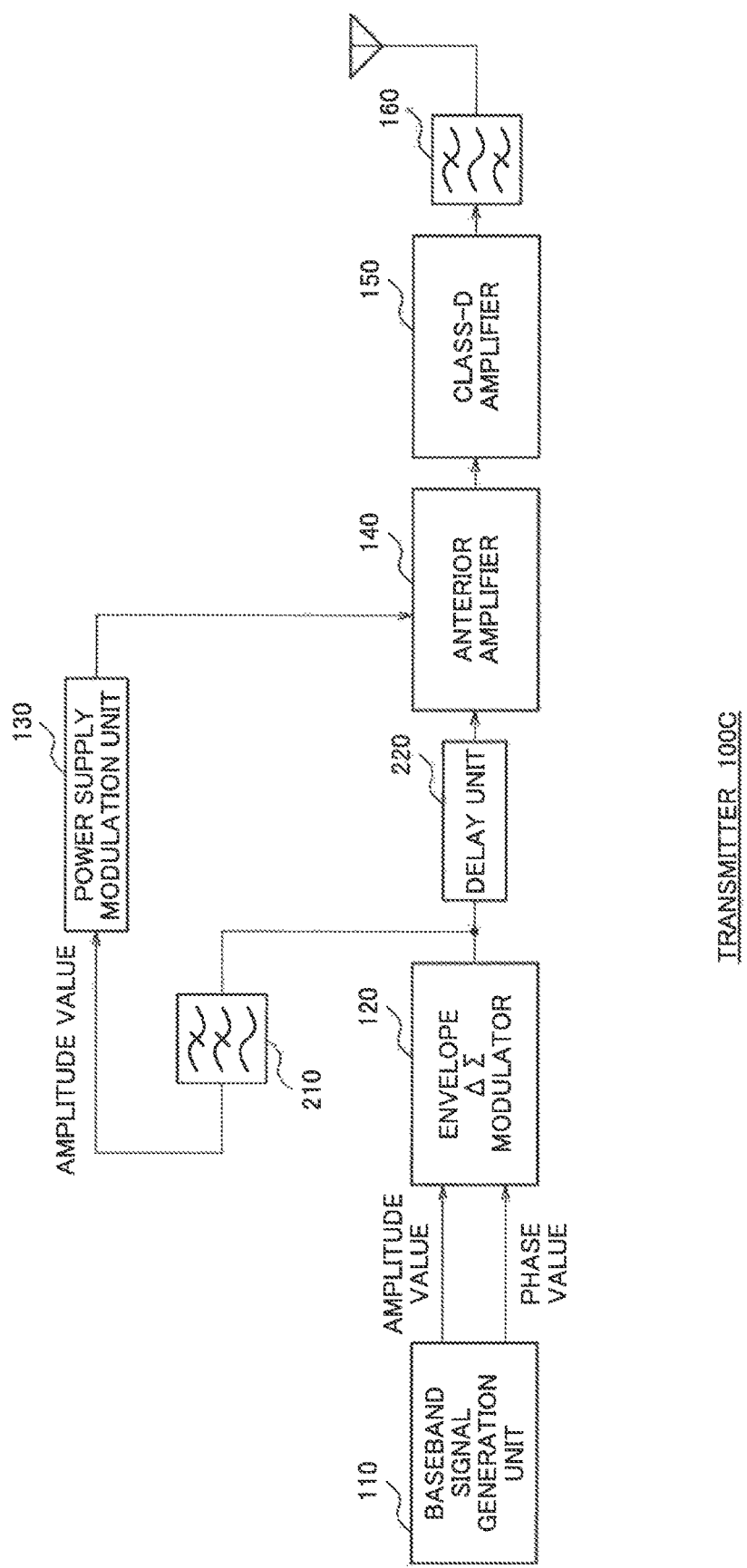
FIG. 5 is a block configuration diagram of another transmitter 100C according to the modification of the second example embodiment.

A block configuration diagram of a transmitter according to the present example embodiment is illustrated in FIG. 5.

A transmitter 100C in FIG. 5 is configured by disposing a lowpass filter 210 and a power supply modulation unit 130 posterior to the envelope ΔΣ modulator 120 of the transmitter 100 of FIG. 2 and disposing a delay unit 220 between the envelope ΔΣ modulator 120 and the anterior amplifier 140.

In FIG. 5, two kinds of signals, amplitude value and phase value, of the input baseband signal, which are generated in the baseband signal generation unit 110, are not branched but inputted together to the envelope ΔΣ modulator 120. The output pulse signal subjected to a predetermined process in the envelope ΔΣ modulator 120 and outputted therefrom is branched and inputted to the lowpass filter 210 and the delay unit 220.

As the output pulse signal inputted from the envelope ΔΣ modulator 120 to the lowpass filter 210 passes through the lowpass filter 210, only the baseband component is extracted from the output signal and inputted to the power supply modulation unit 130 as an amplitude value of the input signal. The power supply modulation unit 130 calculates a voltage for canceling the AM-PM characteristic of the Class-D amplifier 150, based on the output from the lowpass filter 210, and supplies the voltage to the anterior amplifier 140.

Meanwhile, in the delay unit 220, the output pulse signal inputted from the envelope ΔΣ modulator 120 to the delay unit 220 is provided with a delay amount equal to that occurring in the signal passing through the lowpass filter 210 and the power supply modulation unit 130, and then the output pulse signal is inputted to the anterior amplifier 140. By providing, in the delay unit 220, the delay amount equal to that occurring in the signal passing through the lowpass filter 210 and the power supply modulation unit 130, the voltage supplied to the anterior amplifier 140 is synchronized with the output pulse signal.

<Third Example Embodiment>

Figure 6:
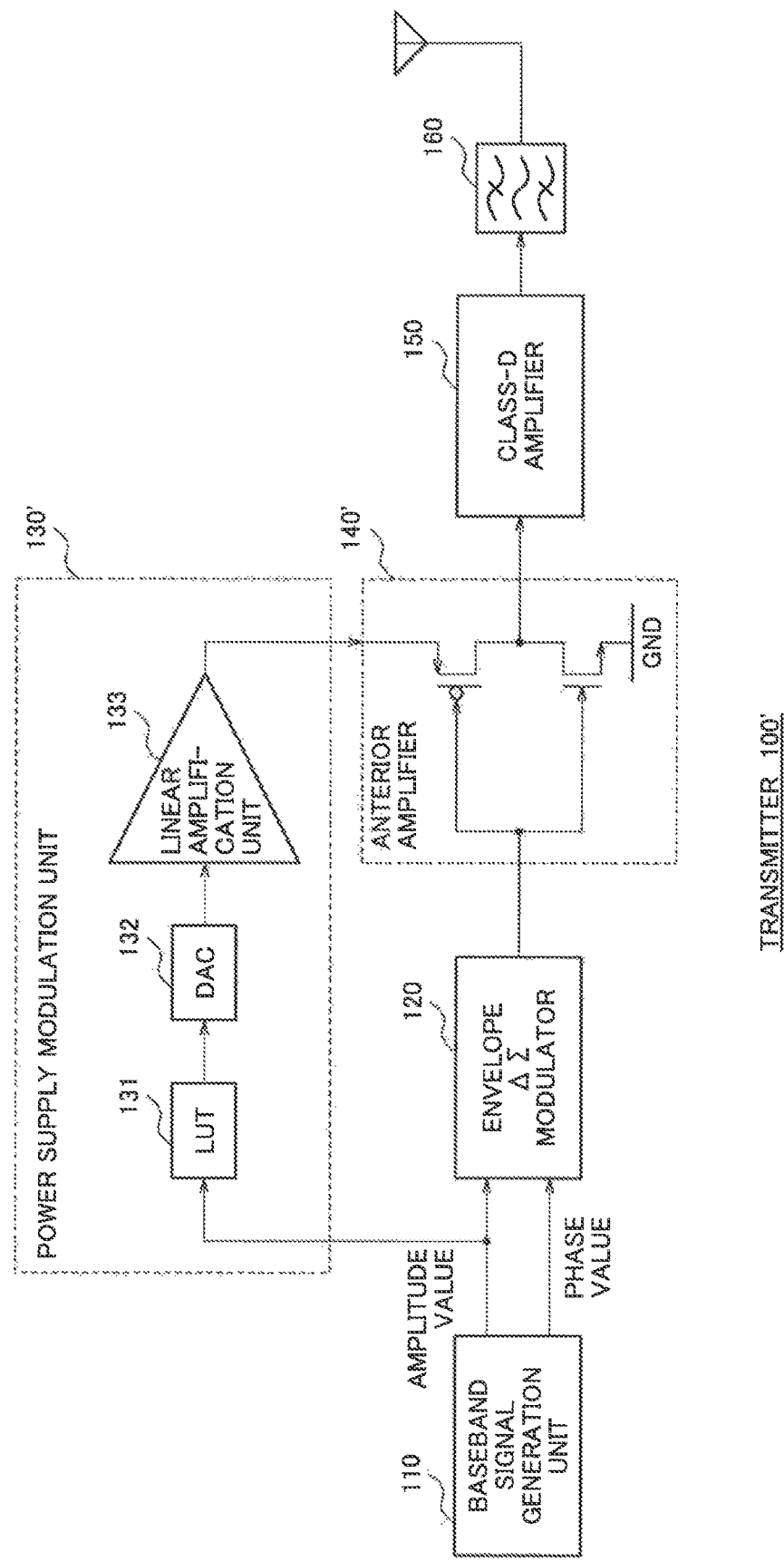
FIG. 6 is a function block diagram of a transmitter 100' according to a third example embodiment.

A third example embodiment will be described. A function block diagram of a transmitter according to the present example embodiment is illustrated in FIG. 6. A transmitter 100' illustrated in FIG. 6 includes a baseband signal generation unit 110, an envelope ΔΣ modulator 120, a power supply modulation unit 130', an anterior amplifier 140', a Class-D amplifier 150, and a bandpass filer 160. The transmitter 100' according to the present example embodiment shows a specific configuration example of the power supply modulation unit 130 and the anterior amplifier 140 of the transmitter 100 illustrated in FIG. 2. A baseband signal generation unit 110, an envelope ΔΣ modulator 120, a Class-D amplifier 150, and a bandpass filer 160 are similar to those of the transmitter 100 in FIG. 2 as described in the second example embodiment.

In FIG. 6, the power supply modulation unit 130' includes an LUT (Look Up Table) 131, a DAC (Digital-to-Analog Converter) 132, and a linear amplification unit 133. The LUT 131 outputs a value at the address associated with the amplitude value inputted from the baseband signal generation unit 110. The DAC 132 converts the value outputted from the LUT 131 into an analog signal and outputs the analog signal. The linear amplification unit 133 amplifies the analog signal outputted from the DAC 132 and supplies the amplified signal to the anterior amplifier 140'. The linear amplification unit 133 may employ a high linearity amplifier such as an operational amplifier or a Class-A amplifier.

Meanwhile, the anterior amplifier 140' is implemented by an inverter circuit with an nMOS and a pMOS transistor and the power is supplied from the power supply modulation unit 130' to the pMOS source. The anterior amplifier 140' may be an inverter using, for example, a resistor in place of the pMOS, a Class-A amplifier or a Class-B amplifier.

Figure 7:
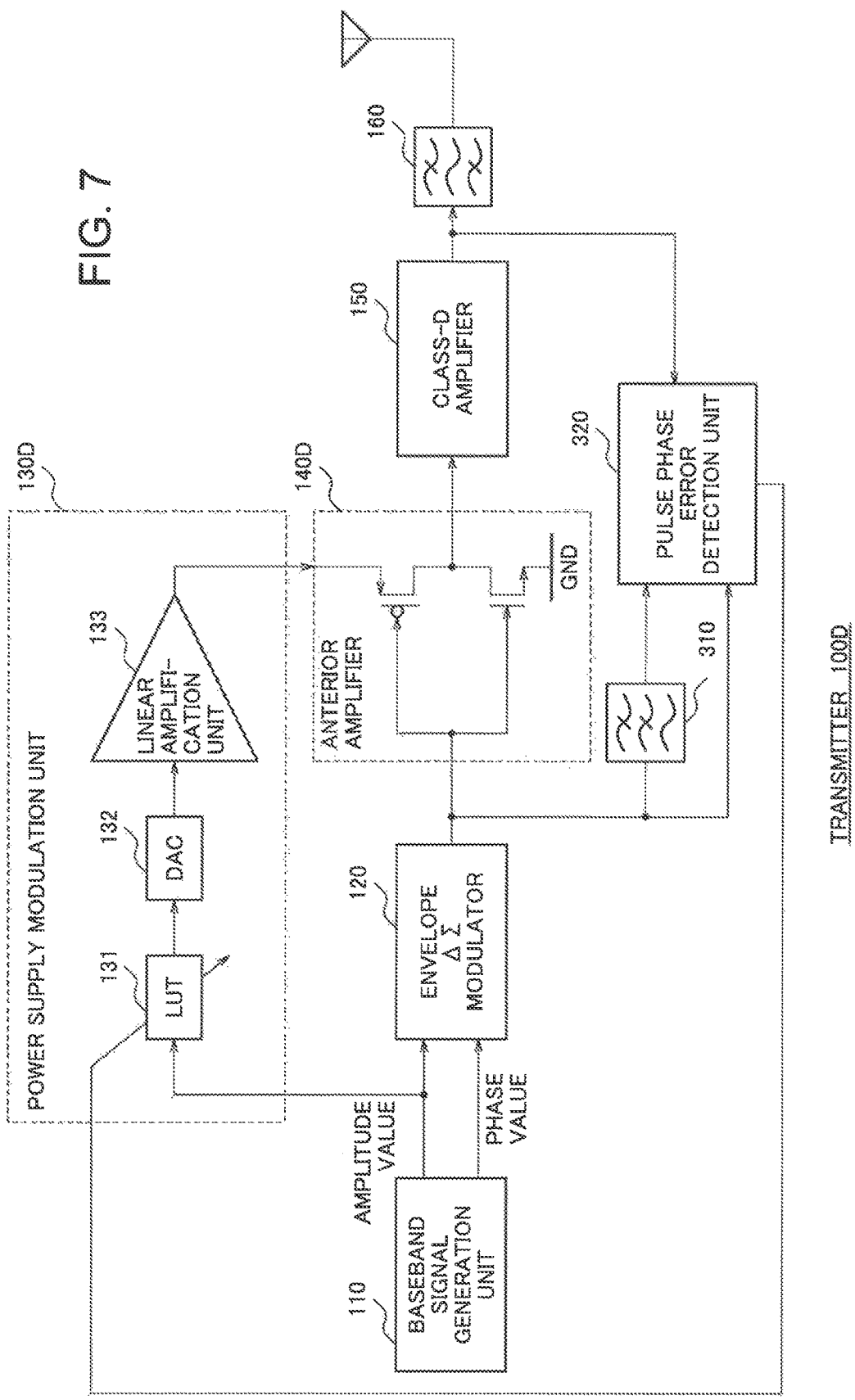
FIG. 7 is a function block diagram of a transmitter 100D according to the third example embodiment.

Next, a way of updating the LUT 131 of the power supply modulation unit 130' of the transmitter 100' with above-described configuration will be described. FIG. 7 is a function block diagram illustrating the transmitter 100' of FIG. 6, provided with a mechanism for updating the LUT 131. A transmitter 100D illustrated in FIG. 7 is provided with a lowpass filter 310 and a pulse phase error detection unit 320 as a mechanism for updating the LUT 131.

The lowpass filter 310 extracts the baseband component of the output pulse signal outputted from the envelope $\Delta\Sigma$ modulator 120 by removing its high frequency component, and outputs the amplitude value of the baseband component to the pulse phase error detection unit 320. The duty cycle of the output pulse signal outputted from the envelope $\Delta\Sigma$ modulator 120 is proportional to the amplitude value of the baseband component, and ranges from 50% for the maximum amplitude value to 0% for the minimum amplitude value. In the present example embodiment, the amplitude value of the baseband component is acquired by exploiting this property, i.e., the duty cycle of the output pulse signal outputted from the envelope $\Delta\Sigma$ modulator 120 is measured, and the amplitude value of the baseband component is acquired based on the duty cycle.

The pulse phase error detection unit 320 receives input of the amplitude value (duty cycle) of the baseband component from the lowpass filter 310 and the respective output pulse signals from the envelope $\Delta\Sigma$ modulator 120 and the Class-D amplifier 150. The pulse phase error detection unit 320 acquires the phase error of the baseband component from the output pulse signal (input signal) inputted from the envelope $\Delta\Sigma$ modulator 120 and the output pulse signal inputted from the Class-D amplifier 150 (output signal). For example, the pulse phase error detection unit 320 synchronizes the two inputted output pulse signals, normalizes the two output pulse signals into binary values of 0 and 1 by a converter, and extracts an error component by a logic circuit, and thereby acquires the phase error of the baseband, contained in the pulse signal.

When the LUT 131 of the power supply modulation unit 130D is controlled by using the above-described lowpass filter 310 and the pulse phase error detection unit 320, the LUT 131 is provided at the initial state with predetermined values (initial values), and the anterior amplifier 140D is provided with a predetermined voltage (a fixed value). The pulse phase error detection unit 320 then detects the phase error for each amplitude value, and updates the value at the address of the LUT 131 associated with each amplitude value in such a way that the acquired phase error is canceled (feedback control).

More specifically, when an amplitude value A1 corresponds to a phase error −C1°, the value at the address of the LUT 131 associated with the amplitude value A1 is decreased. With a decreased value at the address, the voltage of the anterior amplifier 140D becomes lower than the voltage before the change of the value at the address even when the input amplitude of the envelope $\Delta\Sigma$ modulator 120 is A1. This voltage drop lowers the threshold value in the transistors in the anterior amplifier 140D, resulting in a forward shift of the timing of the pulse, increasing the phase component of the baseband in the anterior amplifier 140D toward positive values. Updating amount can be set, for example, at a value proportionate to the phase error amount. In such a case, the value B1 at the address of the LUT 131 corresponding to the amplitude value A1 is updated to B1+kC1, where k is a constant.

Repeated updates of values at the addresses of the LUT 131, based on phase errors acquired in the pulse phase error detection unit 320, allow the value in each address to converge to an optimum value. As all values at the addresses in the LUT 131 associated with the amplitude values are set at the optimum values, the anterior amplifier 140D is provided with an optimum voltage corresponding to the amplitude value, and AM-PM distortion is compensated throughout the digital transmitter.

The baseband signal generation unit 110, the envelope $\Delta\Sigma$ modulator 120, the LUT 131, and the DAC 132 may be implemented, entirely or partly, by a digital circuit such as FPGA (field-programmable gate array) and DSP (Digital Signal Processor).

In addition, similarly to the transmitter 100B in FIG. 4, described in a modification of the second example embodiment, a $\Delta\Sigma$ modulator employing lowpass $\Delta\Sigma$ modulation or bandpass $\Delta\Sigma$ modulation can be used in place of the envelope $\Delta\Sigma$ modulator 120.

<Modification of the Third Example Embodiment>

A modification of the third example embodiment will be described. In the third example embodiment, the pulse phase error detection unit 320 indirectly computes AM-PM distortion by acquiring a phase error, by means of logical operation or the like, of the baseband components contained in the output pulse signal outputted from the envelope $\Delta\Sigma$ modulator 120 and in the output pulse signal outputted from the Class-D amplifier 150. In contrast, in the modification of the third example embodiment, the baseband signal is extracted from the output pulse signal outputted from the envelope $\Delta\Sigma$ modulator 120, and AM-PM distortion is directly calculated from the extracted baseband signal (input signal) and the baseband signal outputted from the bandpass filer 160 (output signal).

Figure 8:
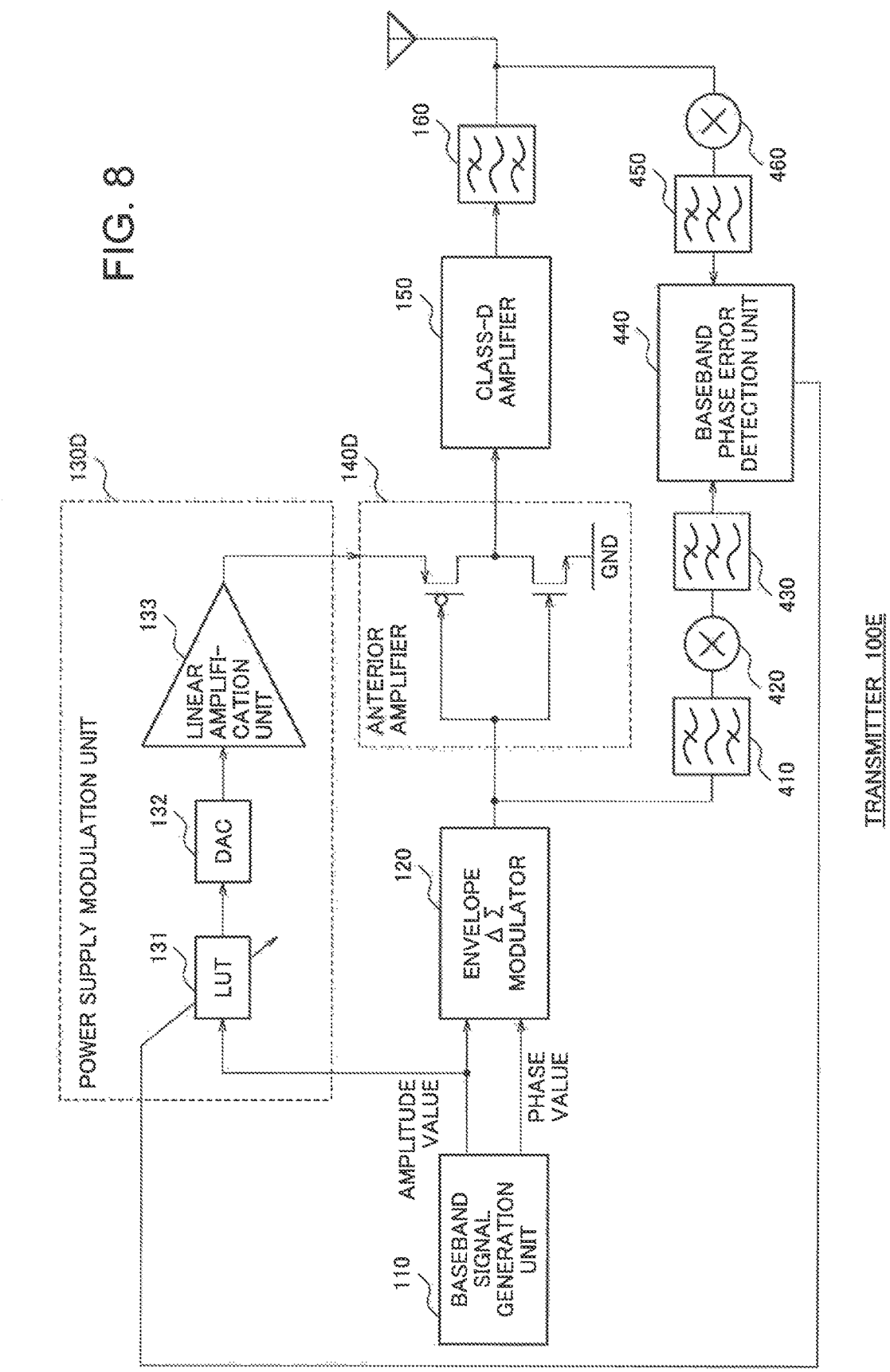
FIG. 8 is a function block diagram of a transmitter 100E according to a modification of the third example embodiment.

A function block diagram of a transmitter according to the modification of the third example embodiment is illustrated in FIG. 8. As illustrated in FIG. 8, a transmitter 100E is configured by providing the transmitter 100D of FIG. 7 described in the third example embodiment with a bandpass filer 410, down-converters 420, 460, lowpass filters 430, 450, and a baseband phase error detection unit 440.

In the transmitter 100E configured as above, the output pulse signal outputted form the envelope $\Delta\Sigma$ modulator 120 is bifurcated and outputted to the bandpass filer 410 and the anterior amplifier 140D.

The output pulse signal inputted to the bandpass filer 410 is restored to an RF signal in the bandpass filer 410, which is then converted to an input baseband signal by the down-converter 420 and the lowpass filter 430, and inputted to the baseband phase error detection unit 440.

Meanwhile, the output pulse signal inputted to the anterior amplifier 140D is amplified in the anterior amplifier 140D in accordance with the voltage supplied by the power supply modulation unit 130D, and amplified in the Class-D amplifier 150 to a desired level with the pattern of the pulse train maintained. The output pulse signal outputted from the Class-D amplifier 150 is restored in the bandpass filer 160 to an RF signal to be transmitted to the outside. The RF signal outputted from the bandpass filer 160 is branched and a part of the signal is inputted to the down-converter 460. Similarly to the input baseband signal, the RF signal inputted to the down-converter 460 is converted to an output baseband signal by the down-converter 460 and the lowpass filter 450, and inputted to the baseband phase error detection unit 440.

The baseband phase error detection unit 440 synchronizes the inputted input baseband signal and the output baseband signal, and detects AM-PM distortion occurring in the transmitter 100E by calculating the phase error between the input and output basebands, which depends on the amplitude value of the input baseband signal. The baseband phase error detection unit 440 then updates the value at the address of the LUT 131 associated with the amplitude value in such a way that the detected AM-PM distortion may be canceled (feedback control).

The baseband signal generation unit 110, the envelope ΔΣ modulator 120, the LUT 131, and the DAC 132 may be implemented, entirely or partly, by a digital circuit such as FPGA and DSP. A ΔΣ modulator employing lowpass ΔΣ modulation or bandpass ΔΣ modulation can be used in place of the envelope ΔΣ modulator 120.

Further, in the modification of the third example embodiment, the input baseband signal inputted to the baseband phase error detection unit 440 is acquired from the output pulse signal outputted from the envelope ΔΣ modulator 120 passing through the bandpass filer 410, the down-converter 420 and the lowpass filter 430, but the input baseband signal may be acquired in other ways. For example, the input baseband signal inputted into the baseband phase error detection unit 440 may be acquired from the baseband signal generation unit 110. A function block diagram of the transmitter 100F in such a case is illustrated in FIG. 9 for reference.

Figure 9:
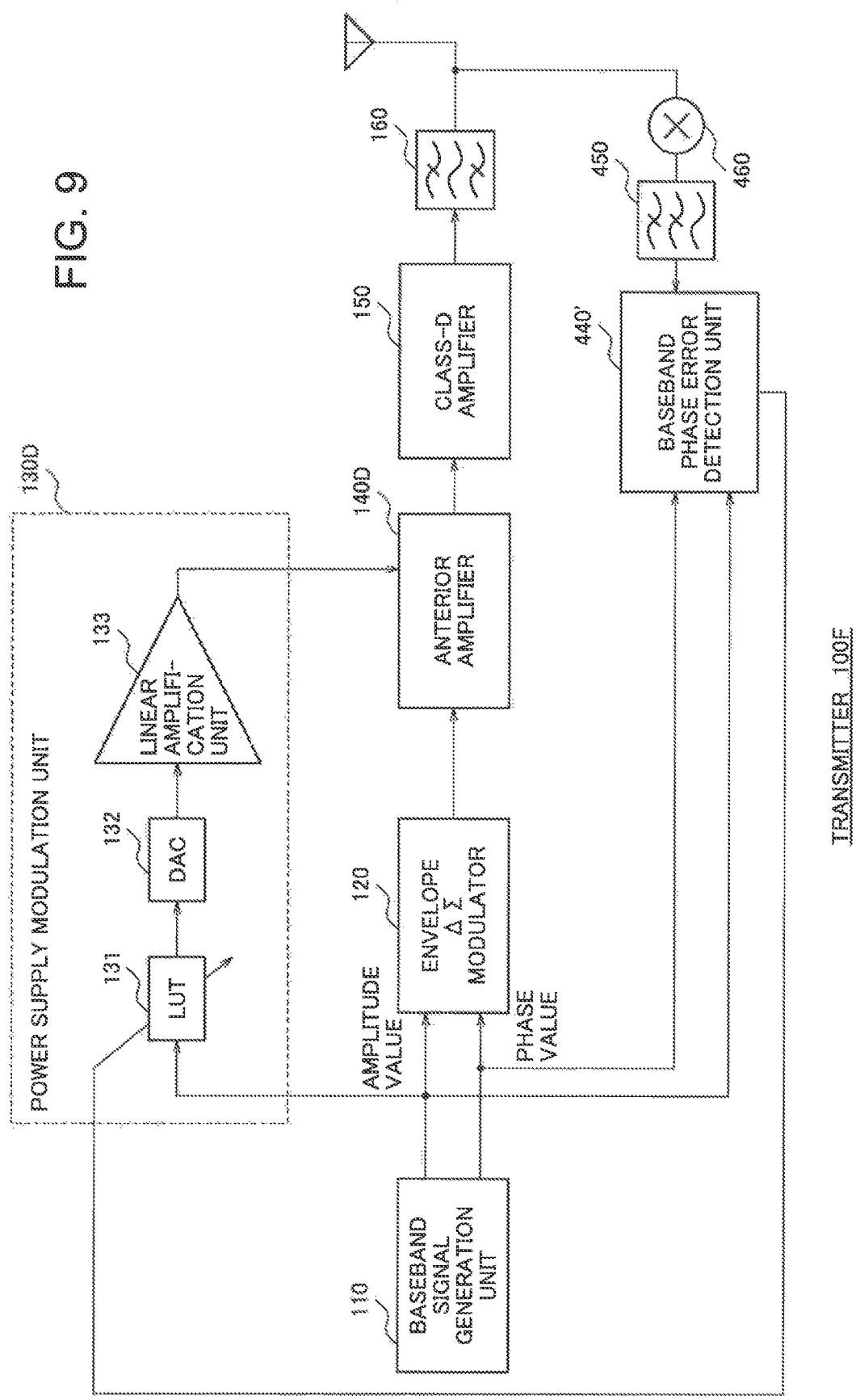
FIG. 9 is a function block diagram of another transmitter 100F according to the modification of the third example embodiment.

In the transmitter 100F in FIG. 9, the baseband phase error detection unit 440' receives input baseband signals (two kinds of signals, amplitude value and phase value) from the baseband signal generation unit 110. The baseband phase error detection unit 440' also receives a part of the RF signal outputted from the bandpass filer 160 through the down-converter 460 and the lowpass filter 450, as the output baseband signal.

The baseband phase error detection unit 440' detects AM-PM distortion occurring in the transmitter 100F by synchronizing the inputted input baseband signal and the output baseband signal, and calculating the phase error. The baseband phase error detection unit 440' then updates the value at the address in the LUT 131 associated with the amplitude value in such a way that the detected AM-PM distortion is canceled (feedback control).

<Forth Example Embodiment>

Figure 10:
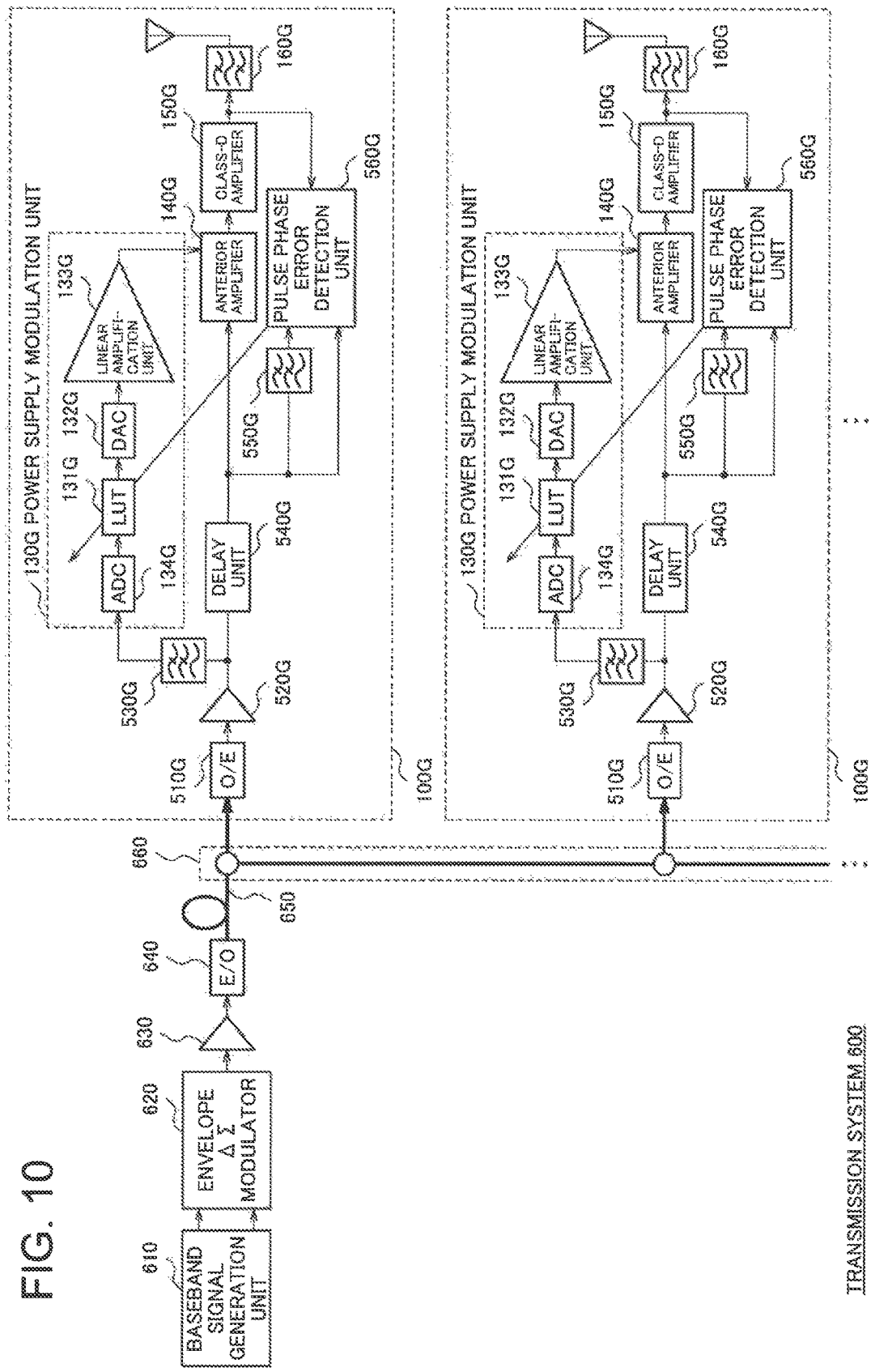
FIG. 10 is a system configuration diagram of a transmission system 600 according to a fourth example embodiment.

A fourth example embodiment will be described. In the present example embodiment, a transmission system provided with a plurality of transmitters according to one of the above-described example embodiments. A system configuration diagram of a transmission system according to the present example embodiment is illustrated in FIG. 10. In FIG. 10, a transmission system 600 includes a baseband signal generation unit 610, an envelope ΔΣ modulator 620, a driver amplifier 630, an E/O (electric-optic) conversion unit 640, an optical fiber 650, a coupler 660, and a plurality of transmission apparatuses 100G.

Further, in FIG. 10, each transmission apparatus 100G includes an O/E (optic-electric) conversion unit 510G, a driver amplifier 520G, a lowpass filter 530G, a power supply modulation unit 130G, a delay unit 540G, an anterior amplifier 140G, a Class-D amplifier 150G, a bandpass filer 160G, a lowpass filter 550G, and a pulse phase error detection unit 560G.

The power supply modulation unit 130G includes an ADC (Analog-to-Digital Converter) 134G, an LUT 131G, a DAC 132G, and a linear amplification unit 133G.

In the transmission system 600 constituted as described above, the amplitude value and the phase value outputted from the baseband signal generation unit 610 are ΔΣ modulated in the envelope ΔΣ modulator 620 and outputted as output pulse signal. The output pulse signal outputted from the envelope ΔΣ modulator 620 is amplified in the driver amplifier 630, converted from an electrical signal to an optical signal in E/O conversion unit 640, and then transmitted via the optical fiber 650 to the coupler 660. The coupler 660 branches and outputs the inputted optical signal to the plurality of transmission apparatuses 100G.

Each of the plurality of transmission apparatuses 100G converts the binary optical signal (of an amplitude value and a phase value), which is transmitted via the optical fiber 650 and branched and inputted to the transmission apparatus 100G by the coupler 660, to an electrical signal in the O/E conversion unit 510G, and amplifies the electrical signal to a desired level in the driver amplifier 520G. The signal amplified in the driver amplifier 520G is branched and outputted to the lowpass filter 530G and the delay unit 540G.

From the signal inputted from the driver amplifier 520G to the lowpass filter 530G, only the baseband component is extracted in the lowpass filter 530G, and the amplitude value is acquired and outputted to the power supply modulation unit 130G. The power supply modulation unit 130G digitizes the inputted signal in the ADC 134G, and performs compensation corresponding to the inputted amplitude value in the LUT 131G. In other words, the LUT 131G outputs a value at the address associated with the inputted amplitude value. The signal on which the compensation has been performed in the LUT 131G is converted to an analog value in the DAC 132G, amplified to a predetermined level in the linear amplification unit 133G, and then supplied to the anterior amplifier 140G as supply voltage.

Meanwhile, in the delay unit 540G, the signal inputted from the driver amplifier 520G to the delay unit 540G is provided with a delay amount equal to that occurring in the signal passing through the lowpass filter 530G and the power supply modulation unit 130G. The signal outputted from the delay unit 540G is branched into three parts, which are outputted to the anterior amplifier 140G, the lowpass filter 550G, and the pulse phase error detection unit 560G.

Subsequent operations are similar to the transmitter 100D in FIG. 7 according to the third example embodiment, and details thereof will not be described herein. In other words, the amplitude value of the baseband, which is acquired by removing high frequency component from the signal in the lowpass filter 550G and extracting the baseband component, is inputted to the pulse phase error detection unit 560G. The pulse phase error detection unit 560G acquires a phase error in the baseband component between the signal inputted from the delay unit 540G and the signal inputted from the Class-D amplifier 150G, and performs a feedback control on the LUT 131G of the power supply modulation unit 130G, based on the acquired amplitude value and the phase error.

Figure 11:
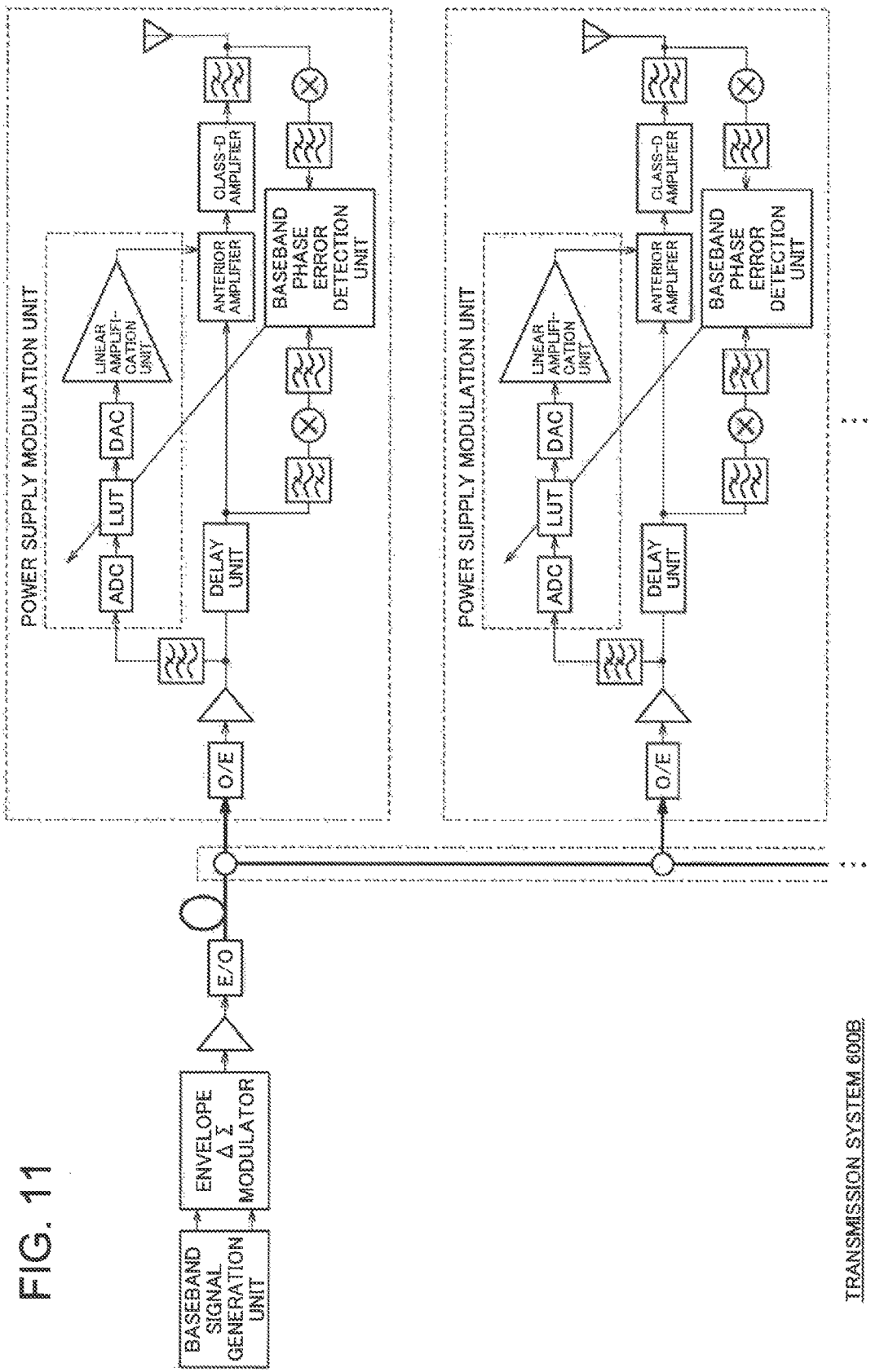
FIG. 11 is a system configuration diagram of another transmission system 600B according to the fourth example embodiment.
Figure 12:
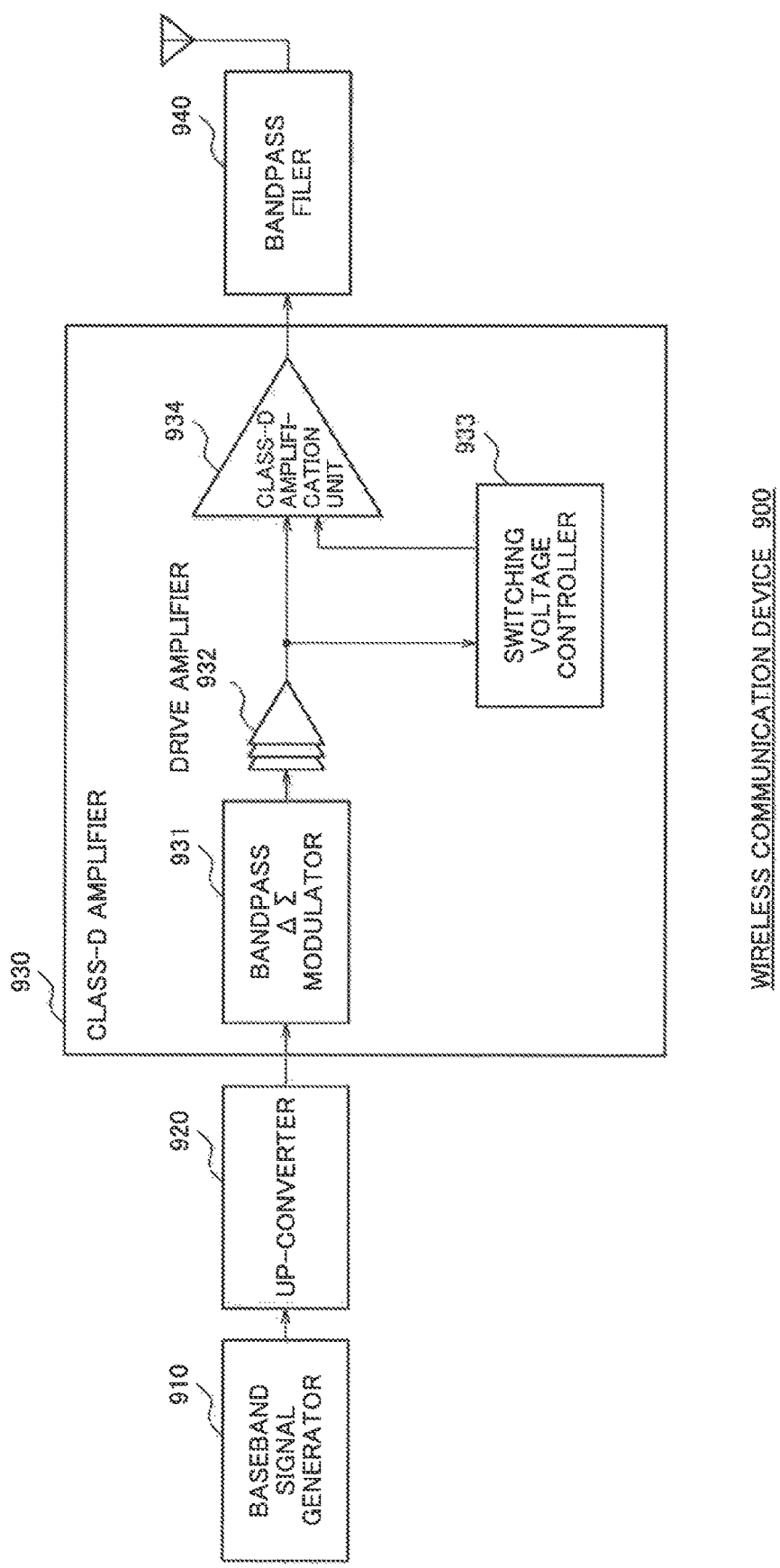
FIG. 12 is a block configuration diagram of a wireless communication device 900 according to PTL 1.
Figure 13:
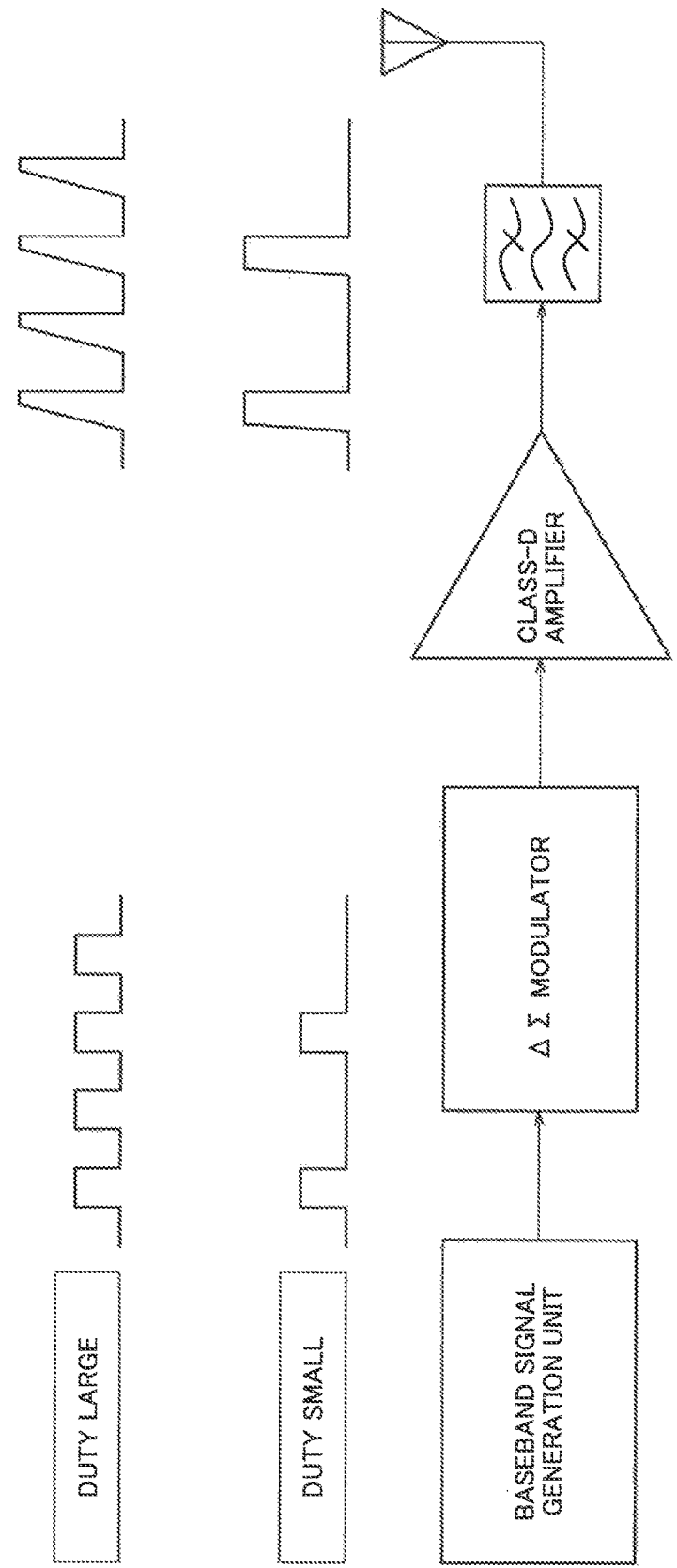
FIG. 13 is a diagram illustrating a relation between duty cycle and distortion of a common digital transmitter.

In the transmission system 600 according to the present example embodiment, the feedback control on the LUT 131G is performed in a similar manner as in the transmitter 100D in FIG. 7 described in the third example embodiment, but the way of performing feedback control is not limited to this. For example, a way similar to the one used for the transmitter 100E in FIG. 8 according to the modification of the third example embodiment may be employed. A system configuration diagram of a transmission system 600B in such a case is illustrated in FIG. 11 for reference. Furthermore, the way of performing a feedback control on the LUT 131G is not limited to this, and, for example, a way similar to the one used for the transmitter 100F in FIG. 9 according to the modification of the third example embodiment may be employed.

The invention of the present application is not limited to the above example embodiments and design modifications and the like that fall within the scope of the spirit of the present invention will also be included in the present invention. In addition, directions of the arrows in the block configuration diagrams, function block diagrams, or system configuration diagrams used in example embodiments are intended to serve as an example only and not intended to limit directions of input/output signals.

INDUSTRIAL APPLICABILITY

The invention of the present application can be widely applied to systems transmitting and/or receiving a ΔΣ modulated transmission signal.

This application claims priority to Japanese Patent Application No. 2014-158400 filed Aug. 4, 2014, which is incorporated herein by reference in its entirety.

[Reference signs List]

| | |
|---|---|
| 10 | Transmitter |
| 20 | Baseband signal generation means |
| 30 | ΔΣ modulation means |
| 40 | Power supply modulation means |
| 50 | Anterior amplifier |
| 60 | Posterior amplifier |
| 70 | Filtering means |
| 100, 100B, 100', 100C, 100D, 100E, 100F | Transmitter |
| 100G | Transmission apparatus |
| 110, 110B, 610 | Baseband signal generation unit |
| 120, 620 | Envelope ΔΣ modulator |
| 130, 130D, 130G | Power supply modulation unit |
| 131 | LUT |
| 132 | DAC |
| 133 | Linear amplification unit |
| 140, 140D, 140G | Anterior amplifier |
| 150, 150G | Class-D amplifier |
| 160, 160G | Bandpass filer |
| 170 | ΔΣ modulator |
| 210, 530G | Lowpass filter |
| 220, 540G | Delay unit |
| 310, 550G | Lowpass filter |
| 320, 560G | Pulse phase error detection unit |
| 410 | Bandpass filer |
| 420, 460 | Down-converter |
| 430, 450 | Lowpass filter |
| 440 | Baseband phase error detection unit |
| 510G | O/E conversion unit |
| 520G | Driver amplifier |
| 600 | Transmission system |
| 630 | Driver amplifier |
| 640 | E/O conversion unit |
| 650 | Optical fiber |
| 660 | Coupler |
| 900 | Wireless communication device |
| 910 | Baseband signal generator |
| 920 | Up-converter |
| 930 | Class-D amplifier |
| 931 | Bandpass ΔΣ modulator |
| 932 | Drive amplifier |
| 933 | Switching voltage controller |
| 934 | Class-D amplification unit |
| 940 | Bandpass filer |

The invention claimed is:

1. A transmitter comprising:
   a baseband signal generation circuit for outputting an amplitude value and a phase value of a baseband signal;
   a ΔΣ modulation circuit for ΔΣ modulating the outputted amplitude value and phase value, and outputting a pulse signal train;
   a power supply modulation circuit for determining a voltage based on the outputted amplitude value, and supplying the determined voltage to an anterior amplifier;
   the anterior amplifier using the supplied voltage to adjust a level of the outputted pulse signal train;
   a posterior amplifier for amplifying the pulse signal train the level of which has been adjusted; and
   a filtering circuit for generating an output signal from the amplified pulse signal train and outputting the output signal;
   wherein the power supply modulation circuit determines, based on the outputted amplitude value, a voltage for canceling a phase error that occurs in the posterior amplifier.

2. The transmitter according to claim 1, further comprising an extracting circuit for extracting an amplitude value of a baseband component from the pulse signal train outputted from the ΔΣ modulation circuit,
   wherein the power supply modulation circuit determines the voltage based on the extracted amplitude value of the baseband component instead of determining the voltage based on the amplitude value outputted from the baseband signal generation circuit.

3. The transmitter according to claim 2, further comprising a delay circuit disposed between the ΔΣ modulation circuit and the anterior amplifier, for providing the outputted pulse signal train with a delay amount equal to a delay amount occurring in a signal passing through the extracting circuit and the power supply modulation circuit.

4. The transmitter according to claim 1, wherein
   the power supply modulation circuit comprises a table in which voltage values are registered, each voltage value associated with an amplitude value, and extracts a voltage value associated with the outputted amplitude value from the table, and uses the extracted voltage value as the determined voltage value.

5. The transmitter according to claim 4, further comprising an updating circuit for detecting a phase error by comparing a state of a signal inputted to the anterior amplifier and a state of a signal outputted from the posterior amplifier, and for updating the table using the phase error detected and an amplitude value at a time of the detection.

6. The transmitter according to claim 5, further comprising a second extracting circuit for extracting an amplitude value of a baseband component by removing a high frequency component from the pulse signal train outputted from the ΔΣ modulation circuit,
   wherein the updating circuit detects a phase error between the pulse signal train outputted from the ΔΣ modulation circuit and the pulse signal train outputted from the posterior amplifier, and updates the voltage value in the table associated with the amplitude value extracted by the second extracting circuit in such a way that the extracted phase error is canceled.

7. The transmitter according to claim 5, wherein the updating circuit detects a phase error between an output baseband signal generated from the output signal outputted from the filtering circuit and one of an input baseband signal outputted from the baseband signal generation circuit and an input baseband signal generated from the pulse signal train outputted from the ΔΣ modulation circuit, and updates a voltage value in the table associated with an amplitude value of the input baseband signal in such a way that the extracted phase error is canceled.

8. The transmitter according to claim 1, wherein
   the outputted pulse signal train is provided with an AM-PM distortion as the pulse signal train passes through the anterior amplifier, the AM-PM distortion having an inverse characteristic of the AM-PM distortion that occurs in the posterior amplifier, and
   the posterior amplifier amplifies the pulse signal train provided with the AM-PM distortion to a desired level with a pattern of the pulse train maintained.

9. A transmission system comprising:
- a baseband signal generation circuit for outputting an amplitude value and a phase value of a baseband signal;
- a ΔΣ modulation circuit for ΔΣ modulating the outputted amplitude value and phase value, and outputting a pulse signal train;
- a branching circuit for branching the outputted pulse signal train into n parts and outputting the parts;
- n transmission circuits to which the n parts of the branched pulse signal train are respectively inputted;
- wherein each of the n transmission circuits comprises:
- an extracting circuit for extracting an amplitude value of a baseband component from the inputted pulse signal train and outputs the amplitude value;
- a power supply modulation circuit for determining a voltage for canceling a phase error that occurs in a posterior amplifier, based on the amplitude value of the extracted baseband component, and for supplying the determined voltage to an anterior amplifier;
- the anterior amplifier using the supplied voltage to adjusting a level of the inputted pulse signal train;
- the posterior amplifier amplifying the pulse signal train the level of which has been adjusted; and
- a filtering circuit for generating an output signal from the amplified pulse signal train and outputting the output signal.

10. A transmission method using a transmitter comprising an anterior amplifier using a supplied voltage to adjust a level of a pulse signal train and a posterior amplifier for amplifying the inputted pulse signal train, the method comprising:
- outputting an amplitude value and a phase value of a baseband signal;
- ΔΣ modulating the outputted amplitude value and phase value and outputting a pulse signal train;
- determining a voltage, based on the outputted amplitude value, for canceling a phase error that occurs in the posterior amplifier, and supplying the determined voltage to the anterior amplifier;
- adjusting in the anterior amplifier a level of the outputted pulse signal train;
- amplifying in the posterior amplifier the pulse signal train the level of which has been adjusted; and
- generating an output signal from the amplified pulse signal train and transmitting the output signal.

11. The transmitter according to claim 4, further comprising an extracting circuit for extracting an amplitude value of a baseband component from the pulse signal train outputted from the ΔΣ modulation circuit,
- wherein the power supply modulation circuit determines the voltage based on the extracted amplitude value of the baseband component instead of determining the voltage based on the amplitude value outputted from the baseband signal generation circuit.

12. The transmitter according to claim 4, further comprising a delay circuit disposed between the ΔΣ modulation circuit and the anterior amplifier, for providing the outputted pulse signal train with a delay amount equal to a delay amount occurring in a signal passing through the extracting circuit and the power supply modulation circuit.

13. The transmitter according to claim 11, further comprising a delay circuit disposed between the ΔΣ modulation circuit and the anterior amplifier, for providing the outputted pulse signal train with a delay amount equal to a delay amount occurring in a signal passing through the extracting circuit and the power supply modulation circuit.

14. The transmitter according to claim 2, wherein
- the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

15. The transmitter according to claim 3, wherein
- the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

16. The transmitter according to claim 4, wherein
- the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

17. The transmitter according to claim 5, wherein
- the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

18. The transmitter according to claim 6, wherein
- the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

19. The transmitter according to claim 7, wherein the outputted pulse signal train is provided with an AM-PM distortion as the pulse signal train passes through the anterior amplifier, the AM-PM distortion having an inverse characteristic of the AM-PM distortion that occurs in the posterior amplifier, and
- the posterior amplifier amplifies the pulse signal train provided with the AM-PM distortion to a desired level with a pattern of the pulse train maintained.

* * * * *

UNITED STATES PATENT AND TRADEMARK OFFICE
CERTIFICATE OF CORRECTION

PATENT NO. : 9,917,556 B2
APPLICATION NO. : 15/501465
DATED : March 13, 2018
INVENTOR(S) : Masaaki Tanio Page 1 of 1

It is certified that error appears in the above-identified patent and that said Letters Patent is hereby corrected as shown below:

In the Specification

Column 5, Description of Embodiments, Line 2; "odulation," has been replaced with --modulation,-- therefor Column 12, Description of Embodiments, Line 5; "0/E" has been replaced with --O/E-- therefor In the Claims Column 16, Claim 19, Line 51; after "wherein", insert --¶--

Signed and Sealed this
Twenty-second Day of January, 2019

Andrei Iancu
*Director of the United States Patent and Trademark Office*